US012648201B2

(12) United States Patent

Gong et al.

(10) Patent No.: US 12,648,201 B2

(45) Date of Patent: *Jun. 2, 2026

(54) SEMICONDUCTOR POWER DEVICE

(71) Applicant: SUZHOU ORIENTAL SEMICONDUCTOR CO., LTD., Jiangsu (CN)

(72) Inventors: Yi Gong, Jiangsu (CN); Zhendong Mao, Jiangsu (CN); Wei Liu, Jiangsu (CN); Zhenyi Xu, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 513 days.

This patent is subject to a terminal disclaimer.

(21) Appl. No.: 18/016,727

(22) PCT Filed: Nov. 18, 2021

(86) PCT No.: PCT/CN2021/131555

§ 371 (c)(1),
(2) Date: Jan. 18, 2023

(87) PCT Pub. No.: WO2022/174636

PCT Pub. Date: Aug. 25, 2022

(65) Prior Publication Data

US 2023/0299143 A1 Sep. 21, 2023

(30) Foreign Application Priority Data

Feb. 19, 2021 (CN) .......................... 202110191872.0

(51) Int. Cl.
*H01L 29/66* (2006.01)
*H10D 30/66* (2025.01)
(Continued)

(52) U.S. Cl.
CPC ......... *H10D 62/393* (2025.01); *H10D 30/668* (2025.01); *H10D 62/13* (2025.01)

(58) Field of Classification Search
CPC .. H10D 62/393; H10D 62/127; H10D 62/152; H01L 23/58
See application file for complete search history.

(56) References Cited

U.S. PATENT DOCUMENTS 5,168,331 A * 12/1992 Yilmaz .............. H10D 30/0297
257/E29.066
2011/0254088 A1* 10/2011 Darwish ............ H10D 30/0297
257/341

(Continued)

FOREIGN PATENT DOCUMENTS

| CN | 108257953 A | 7/2018 |
| CN | 109755238 A | 5/2019 |
| CN | 110335895 A | 10/2019 |

OTHER PUBLICATIONS

PCT/CN2021/131555 International Search Report dated Feb. 22, 2022.

*Primary Examiner* — Ismail A Muse

(74) *Attorney, Agent, or Firm* — Michael Best & Friedrich LLP

(57) ABSTRACT

Provided is a semiconductor power device. The semiconductor power device includes a semiconductor substrate and p-type body regions disposed in the semiconductor substrate. The p-type body regions are in contact with a source metal layer. The semiconductor substrate includes at least one first region, and a region of the semiconductor substrate outside the at least one first region is a second region. A p-type body region of p-type body regions in the first region is provided with a first p-type body region contact region, and the source metal layer is in contact with the first p-type body region contact region to form an ohmic contact. Each (Continued)

of p-type body regions in the second region forms no ohmic contact with the source metal layer.

11 Claims, 2 Drawing Sheets

(51) Int. Cl.
    *H10D 62/13*           (2025.01)
    *H10D 62/17*           (2025.01)

(56)               References Cited

U.S. PATENT DOCUMENTS

| | | | |
|---|---|---|---|
| 2012/0181575 A1 | 7/2012 | Pfirsch | |
| 2013/0001592 A1* | 1/2013 | Miyahara | H10D 64/513 |
| | | | 257/77 |
| 2014/0027814 A1* | 1/2014 | Pfirsch | H10D 30/66 |
| | | | 257/139 |
| 2014/0054691 A1* | 2/2014 | Yilmaz | H10D 30/0295 |
| | | | 438/270 |
| 2015/0179636 A1 | 6/2015 | Pfirsch et al. | |
| 2017/0213908 A1* | 7/2017 | Fursin | H10D 62/106 |
| 2017/0373185 A1* | 12/2017 | Yilmaz | H10D 64/117 |
| 2019/0172910 A1* | 6/2019 | Siemieniec | H10D 64/513 |

* cited by examiner

SEMICONDUCTOR POWER DEVICE

CROSS-REFERENCE TO RELATED APPLICATION(S)

This is a national stage application filed under 37 U.S.C. 371 based on International Patent Application No. PCT/CN2021/131555, filed Nov. 18, 2021, which claims priority to Chinese Patent Application No. 202110191872.0 filed with the China National Intellectual Property Administration (CNIPA) on Feb. 19, 2021, the disclosures of which are incorporated herein by reference in their entireties.

TECHNICAL FIELD

The present application belongs to the technical field of semiconductor devices, and for example, relates to a semiconductor power device.

BACKGROUND

For a semiconductor power device in the related art, a Miller capacitance of the device is typically reduced so that a switching speed is improved so as to reduce a switching loss. However, too fast a switching speed results in large voltage and current oscillations, which leads to a serious electromagnetic interference (EMI) when the semiconductor power device is applied.

SUMMARY

The present application provides a semiconductor power device, so as to reduce an EMI caused when the semiconductor power device is applied.

The present application provides a semiconductor power device.

The semiconductor power device includes a semiconductor substrate and p-type body regions disposed in the semiconductor substrate.

The p-type body regions are in contact with a source metal layer.

The semiconductor substrate includes at least one first region, and a region of the semiconductor substrate outside the at least one first region is a second region.

A p-type body region of p-type body regions in the at least one first region is provided with a first p-type body region contact region, and the source metal layer is in contact with the first p-type body region contact region to form an ohmic contact.

Each of p-type body regions in the second region forms no ohmic contact with the source metal layer.

DETAILED DESCRIPTION

The technical solution of the present application is completely described hereinafter in conjunction with drawings in embodiments of the present application. It is to be understood that the terms used in the present application such as "have", "comprise", and "include" do not exclude the presence of at least one other element or a combination thereof.

It is to be understood by those skilled in the art that a semiconductor power device chip includes a cell region and a terminal region. The cell region is a current working region, and the terminal region is configured to increase withstand voltages of cells on the edge of the cell region. The semiconductor power device described in the embodiments of the present application refers to the cell region in the semiconductor power device chip.

Figures 1, 2:
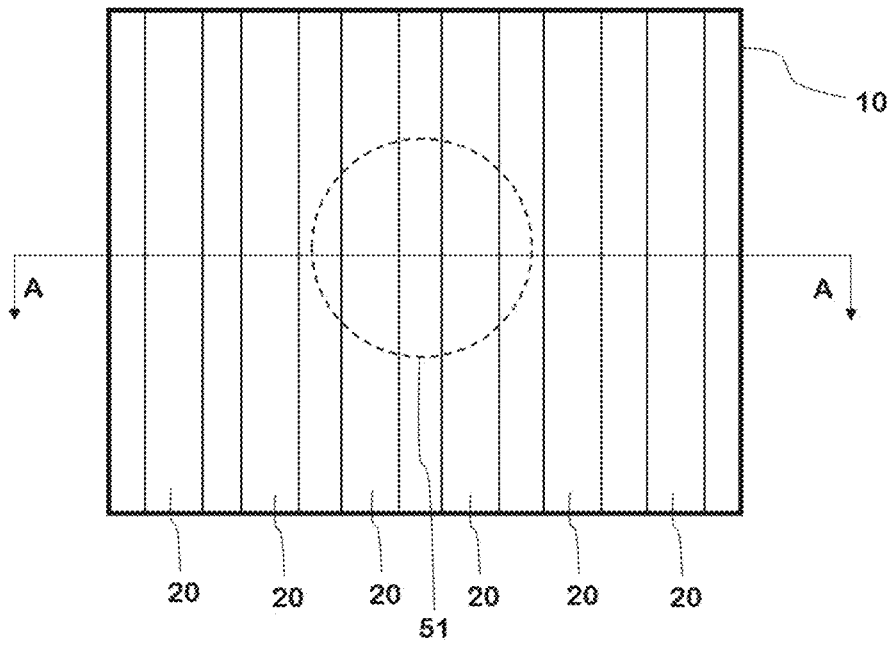
FIG. 1 is a top view of a first embodiment of a semiconductor power device according to the present application.
FIG. 2 is a sectional view of a structure shown in FIG. 1 along an AA direction.

FIG. 1 is a top view of a first embodiment of a semiconductor power device according to the present application, and FIG. 2 is a sectional view of a structure shown in FIG. 1 along an AA direction. As shown in FIGS. 1 and 2, the semiconductor power device of the present application includes a semiconductor substrate 10 which is typically a silicon substrate. The semiconductor substrate 10 includes an n-type drain region 11 and an n-type drift region 12 disposed above the n-type drain region 11. The semiconductor power device of the present application includes p-type body regions 20 disposed in the semiconductor substrate 10, where each of the p-type body regions 20 forms a PN junction structure with the n-type drift region 12. The cell region of the semiconductor power device chip includes several p-type body regions. Only six p-type body regions 20 are exemplarily shown in FIGS. 1 and 2. The semiconductor power device of the present application further includes n-type source regions 21 disposed in the p-type body regions 20, where the p-type body regions 20 and the n-type source regions 21 are each in contact with the source metal layer 17.

As shown in FIG. 1, the semiconductor substrate 10 includes at least one first region 51 in a top view of an upper surface of the semiconductor substrate 10. The number and shape of the at least one first region 51 are not specifically limited in the present application. Only one first region 51 is exemplarily shown in FIG. 1 and the first region 51 has a circular structure. A region of the semiconductor substrate 10 outside the at least one first region 51 is defined as a second region.

A p-type body region 20 of p-type body regions 20 in the at least one first region 51 is provided with a first p-type body region contact region 22. The source metal layer 17 is in contact with the first p-type body region contact region 22 to form an ohmic contact. The doping concentration of the first p-type body region contact region 22 is higher than the doping concentration of a p-type body region 20. Therefore, the first p-type body region contact region 22 increases the doping concentration of the position where the p-type region 20 is in contact with the source metal layer 17 so that each of the p-type body regions 20 in the at least one first region 51 forms the ohmic contact with the source metal layer 17.

Each of p-type body regions 20 in the second region has a relatively low doping concentration. Therefore, each of the p-type body regions 20 in the second region forms no ohmic contact with the source metal layer 17 after being in contact with the source metal layer 17. Optionally, a second p-type body region contact region 80 may be formed in a p-type body region 20 of the p-type body regions 20 in the second region. However, the doping concentration of the second p-type body region contact region 80 is lower than the doping concentration of the first p-type body region contact region 22 so that the second p-type body region contact region 80 forms no ohmic contact with the source metal layer 17 after being in contact with the source metal layer 17, or the second p-type body region contact region 80 forms, after being in contact with the source metal layer 17, the ohmic contact having a relatively high resistance with the source metal layer 17.

The semiconductor power device of the present application further includes gate structures, each of the gate structures includes a gate dielectric layer 14 and a gate 15. Each of the gate structures is isolated from the source metal layer 17 via an interlayer insulating layer 16. The gate structures of the semiconductor power device of the present application may be planar gate structures or trench gate structures. Referring to FIG. 2, the present application includes gate trenches 70 recessed in the semiconductor substrate 10, where the gate dielectric layer 14 and the gate 15 are disposed in a respective one of the gate trenches 70. The gate structures of the present application are shown as the trench gate structures and further include shielded gates 19. Each of the shielded gates 19 is disposed at lower portion in a respective one of the gate trenches 70, and the gate 15 is disposed at upper portions in the respective one of the gate trenches 70. For example, each of the shielded gates 19 is isolated from the semiconductor substrate 10 via an oxide layer 18, and each of the shielded gates 19 is isolated from the respective gate 15 via the gate dielectric layer 14. Optionally, the shielded gates 19 are isolated from the semiconductor substrate 10 via the oxide layers 18, and the shielded gates 19 are isolated from the gates 15 via the oxide layers 18. The oxide layers 18 and the gate dielectric layers 14 are both insulating dielectric layers. In FIG. 2, the gates 15 are disposed above the shielded gates 19. Optionally, each of the shielded gates 19 may extend upward from the lower portion to the upper portions in the respective one of gate trenches 70, which are not shown in the embodiments of the present application.

In the semiconductor power device of the present application, each of the p-type body regions 20 in the at least one first region 51 forms the ohmic contact with the source metal layer 17 via the first p-type body region contact region 22, and each of the p-type body regions 20 in the second region forms no ohmic contact with the source metal layer 17. The p-type body regions 20 forming no ohmic contact have unfixed electric potentials, which results in changes in a threshold voltage Vth. In addition, if a p-type body region 20 forming no ohmic contact is farther away from a p-type body region 20 forming the ohmic contact, a greater difference exists between a threshold voltage Vth of the p-type body region forming no ohmic contact and a threshold voltage Vth of the p-type body region forming the ohmic contact. That is, a difference between a threshold voltage of a p-type body region in the second region close to the first region and a threshold voltage of a p-type body region in the first region is less than a difference between a threshold voltage of a p-type body region in the second region far away from the first region and the threshold voltage of the p-type body region in the first region. Thus, the semiconductor power device of the present application has a gradually changing threshold voltage Vth. A current and a voltage are not easily changed abruptly when the semiconductor power device is turned on and off, which may reduce a voltage oscillation, a current oscillation, and an EMI caused when the semiconductor power device is applied and may improve the reverse recovery characteristic of the semiconductor power device.

Figure 3:
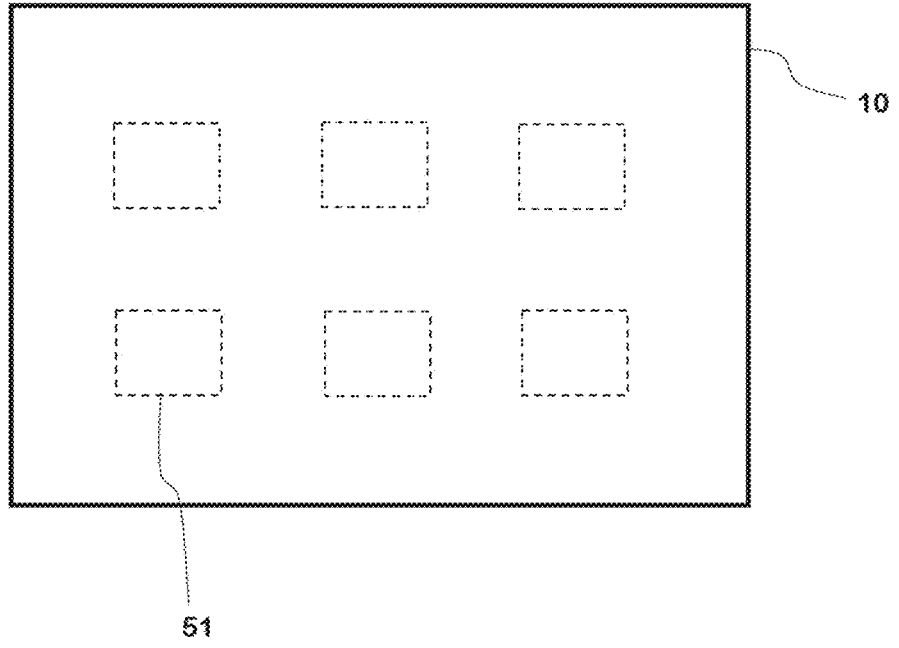
FIG. 3 is a top view of a second embodiment of a semiconductor power device according to the present application.

FIG. 3 is a top view of a second embodiment of the semiconductor power device according to the present application. In FIG. 3, a semiconductor substrate 10 includes six first regions 51. The first regions 51 are rectangular. Optionally, each of the first regions 51 may be a regular pattern such as a polygon (for example, a triangle, a square, a regular polygon, a rectangle, a parallelogram, and a trapezoid), a circle, or an ellipse. Alternatively, each of the first regions 51 may be an irregular pattern. The shape of the first regions 51 is not limited in the embodiments of the present application. A top-view shape of each of the first regions 51 only needs to be a closed pattern, for example, a closed pattern which straight lines and/or curves are successively connected end to end to form.

In the top views shown in FIGS. 1 and 3, that the first region is surrounded by the second region is used as an example for the description. It is to be noted that a relative positional relationship between the first region and the second region is not limited in the embodiments of the present application. The relative positional relationship may be as shown in FIGS. 1 and 3, that the second region is surrounded by the first region, or that the first region and the second region are successively disposed along a direction parallel to the plane where the semiconductor substrate is located.

What is claimed is:

1. A semiconductor power device, comprising:
   a semiconductor substrate; and
   p-type body regions disposed in the semiconductor substrate, wherein the p-type body regions are in contact with a source metal layer;
   wherein the semiconductor substrate comprises at least one first region, and a region of the semiconductor substrate outside the at least one first region is a second region; wherein, on a plane parallel to an upper surface of the semiconductor substrate, a top-view shape of each first region of the at least one first region is a closed pattern, and each said first region is surrounded by the second region;
   a p-type body region of p-type body regions in the at least one first region is provided with a first p-type body region contact region, the source metal layer is in contact with the first p-type body region contact region, and each of p-type body regions in the at least one first region forms an ohmic contact with the source metal layer via the first p-type body region contact region; and
   each of p-type body regions in the second region forms no ohmic contact with the source metal layer;
   wherein the semiconductor power device further comprises n-type source regions disposed in the p-type body regions of the at least one first region and the second region, wherein the n-type source regions are in contact with the source metal layer;
   wherein a difference between a threshold voltage of a p-type body region in the second region close to the first region and a threshold voltage of a p-type body region in the first region is less than a difference between a threshold voltage of a p-type body region in the second region far away from the first region and the threshold voltage of the p-type body region in the first region.

2. The semiconductor power device according to claim 1, wherein a shape of the at least one first region comprises at least one of a polygon, a circle, or an ellipse.

3. The semiconductor power device according to claim 1, wherein a p-type body region of the p-type body regions in the second region is provided with a second p-type body region contact region, and a doping concentration of the second p-type body region contact region is lower than a doping concentration of the first p-type body region contact region.

4. The semiconductor power device according to claim 3, wherein the source metal layer is in contact with the second p-type body region contact region but no ohmic contact is formed between the source metal layer and the second p-type body region contact region.

5. The semiconductor power device according to claim 1, wherein the semiconductor substrate comprises an n-type drain region and an n-type drift region disposed above the n-type drain region, and each of the p-type body regions forms a PN junction structure with the n-type drift region.

6. The semiconductor power device according to claim 1, further comprising gate structures, each of the gate structures comprises a gate dielectric layer and a gate.

7. The semiconductor power device according to claim 6, further comprising gate trenches recessed in the semiconductor substrate, wherein the gate dielectric layer and the gate are disposed in a respective one of the gate trenches.

8. The semiconductor power device according to claim 7, further comprising shielded gates, wherein each of the shielded gates is disposed at lower portion in a respective one of the gate trenches, the gate is disposed at upper portion in the respective one of the gate trenches, and each of the shielded gates is isolated from the semiconductor substrate and the respective gate via an insulating dielectric layer.

9. The semiconductor power device according to claim 8, wherein each of the shielded gates extends upward from the lower portion to the upper portion in the respective one of the gate trenches.

10. The semiconductor power device according to claim 6, wherein each of the gate structures is isolated from the source metal layer via an interlayer insulating layer.

11. The semiconductor power device according to claim 6, wherein the gate structures are planar gate structures or trench gate structures.

* * * * *